United States Patent
Cheng et al.

[11] Patent Number: 6,146,991
[45] Date of Patent: Nov. 14, 2000

[54] BARRIER METAL COMPOSITE LAYER FEATURING A THIN PLASMA VAPOR DEPOSITED TITANIUM NITRIDE CAPPING LAYER

[75] Inventors: Kuo-Hsien Cheng, Hsin Chu; Ting-Chun Wang, Tao-Yan, both of Taiwan

[73] Assignee: Taiwan Semiconductor Manufacturing Company, Hsin-Chu, Taiwan

[21] Appl. No.: 09/389,888

[22] Filed: Sep. 3, 1999

[51] Int. Cl.[7] .................................................. H01L 21/44
[52] U.S. Cl. .......................... 438/622; 438/297; 438/584; 438/597; 438/618
[58] Field of Search .................................. 438/622, 618, 438/597, 584, 297

[56] References Cited

U.S. PATENT DOCUMENTS

| | | | |
|---|---|---|---|
| 5,188,979 | 2/1993 | Filipiak | 437/192 |
| 5,391,517 | 2/1995 | Gelatos et al. | 437/190 |
| 5,420,072 | 5/1995 | Fiordalice et al. | 437/192 |
| 5,610,099 | 3/1997 | Stevens et al. | 437/192 |
| 5,833,817 | 11/1998 | Tsai et al. | 204/192.17 |
| 5,882,399 | 3/1999 | Ngan et al. | 117/89 |
| 5,893,749 | 4/1999 | Matumoto | 438/627 |
| 5,899,725 | 5/1999 | Harshfield | 438/398 |
| 5,899,740 | 5/1999 | Kwon | 438/627 |
| 5,918,149 | 7/1999 | Besser et al. | 438/680 |
| 5,953,576 | 9/1999 | Choi | 438/3 |
| 5,990,004 | 11/1999 | Yang et al. | 438/648 |
| 6,010,940 | 1/2000 | Lee et al. | 438/396 |
| 6,037,252 | 3/2000 | Hillman et al. | 438/637 |
| 6,054,771 | 4/2000 | Drynan | 257/764 |
| 6,066,891 | 5/2000 | Yamaoka et al. | 257/751 |

*Primary Examiner*—Matthew Smith
*Assistant Examiner*—Granvill D. Lee, Jr.
*Attorney, Agent, or Firm*—George O. Saile; Stephen B. Ackerman

[57] ABSTRACT

A process for fabricating a tungsten plug, in a deep, small diameter opening, featuring a novel adhesive-barrier composite layer, located along the sides of the deep, small diameter opening, has been developed. The process features the use of a first titanium nitride barrier layer, deposited on an underlying titanium adhesive layer, via chemical vapor deposition procedures, used to enhance the conformality properties of the first titanium nitride barrier layer. A second titanium nitride barrier layer is then deposited, via plasma vapor deposition procedures, protecting the underlying CVD titanium nitride layer from the environment, while providing an improved surface for subsequent nucleation of a CVD tungsten layer.

20 Claims, 2 Drawing Sheets

BARRIER METAL COMPOSITE LAYER FEATURING A THIN PLASMA VAPOR DEPOSITED TITANIUM NITRIDE CAPPING LAYER

BACKGROUND OF THE INVENTION (1) Field of the Invention

The present invention relates to methods used to fabricate semiconductor devices, and more specifically to a method used to form a metal plug structure.

(2) Description of Prior Art

Metal plugs, located in contact, or via holes, are being used in the semiconductor industry, as conductive conduits between underlying and overlying conductive elements of a semiconductor device. The excellent electromigration resistance, as well as the low resistivity of tungsten, have made tungsten an excellent material for the metal plug structures. However to adequately use tungsten as a plug material, adhesive, and barrier layers, have to be employed between the tungsten plug, and the surfaces of the contact or via hole. An underlying adhesion layer, such as titanium, coating the surface of the contact or via hole, formed in an insulator layer, provides the needed adhesion, while an overlying barrier layer, formed between the adhesive layer, and the tungsten layer, protects exposed materials from the reaction products created during the tungsten deposition procedure. Chemical vapor deposition, (CVD), procedures, used to deposit a barrier layer such as titanium nitride, provides improved conformality, or coverage, along the sides of a deep, narrow diameter opening, when compared to titanium nitride layers obtained via plasma vapor deposited, (PVD), procedures. However CVD titanium nitride, barrier layers present difficulties such as providing a poorer nucleation site, for the subsequent, overlying tungsten layer, when compared to PVD titanium nitride layers. In addition aging effects of CVD titanium nitride layer, result in unwanted resistance increases.

This invention will describe a novel composite adhesive-barrier layer, for use with CVD tungsten plugs. Featured in this invention is the deposition of a CVD titanium nitride barrier layer, on an underlying PVD titanium adhesive layer. After subjecting the CVD titanium nitride layer to an anneal cycle, performed in a hydrogen/nitrogen ambient, used to reduce the aging phenomena occurring with CVD titanium nitride layers, a thin PVD titanium nitride layer is deposited, providing the needed nucleation sites for an overlying tungsten deposition. Prior art, such as Ngan et al, in U.S. Pat. No. 5,882,399, describe a titanium-titanium nitride-titanium nitride, composite layer, as a barrier layer protecting aluminum based layers. That prior art however is not applied to narrow diameter contact holes, where a CVD barrier layer, used in this present invention, but absent in this prior art, is needed for conformality, or step coverage. Additional prior art, such as Tsai et al, in U.S. Pat. No. 5,833,817, does apply a titanium-titanium nitride composite layer, along the sides of a contact or via hole, however this prior art uses only a PVD titanium nitride layer, unlike the composite layer described in this invention featuring a annealed, CVD titanium nitride layer, capped with a thin PVD titanium nitride layer.

SUMMARY OF THE INVENTION

It is an object of this invention to form a tungsten plug, in a deep, narrow diameter contact, or via hole, featuring a composite adhesive-barrier layer, along the sides of the contact, or via hole.

It is another object of this invention to use an adhesive-barrier composite layer, comprised of a underlying titanium layer, obtained via PVD procedures, and an overlying, first titanium nitride layer, obtained via CVD procedures, followed by the deposition of a thin, second titanium nitride layer, obtained via PVD procedures.

It is yet another object of this invention to prepare the first titanium nitride layer via deposition using TDMAT, (Ti—$(N(CH_3)_2)_4$), as a source for the CVD procedure, followed by a plasma treatment in a $H_2/N_2$ ambient.

In accordance with the present invention a method for forming a tungsten plug, in a deep, narrow diameter opening, featuring a composite adhesive-barrier layer, comprised of an underlying PVD titanium layer, a CVD titanium nitride layer, and an overlying, capping, PVD titanium nitride layer, located along the sides of the deep, narrow diameter opening, is described. A deep, narrow diameter opening, is formed in an insulator layer, exposing a portion of the top surface of a conductive material, such as an active device region in a semiconductor substrate, or of an underlying metal interconnect structure. A titanium layer, is deposited, using PVD procedures, coating the exposed surfaces of the deep, narrow diameter opening. A conformal, first titanium nitride layer is formed on the underlying titanium layer, obtained via CVD procedures, using TDMAT as a precursor, and finalized via a plasma anneal, in a hydrogen nitrogen ambient. A second titanium nitride layer is deposited via PVD procedures, capping, and overlying the first titanium nitride layer. A tungsten layer is then deposited, via CVD procedures, completely filling the deep, narrow diameter opening. Removal of regions of tungsten, residing on the top surface of the insulator layer, is accomplished via a selective, reactive ion etching procedure, or via a chemical mechanical polishing procedure, resulting in a tungsten plug, in the deep, narrow diameter opening, encased by the composite PVD titanium, CVD titanium nitride, PVD titanium nitride, layer.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
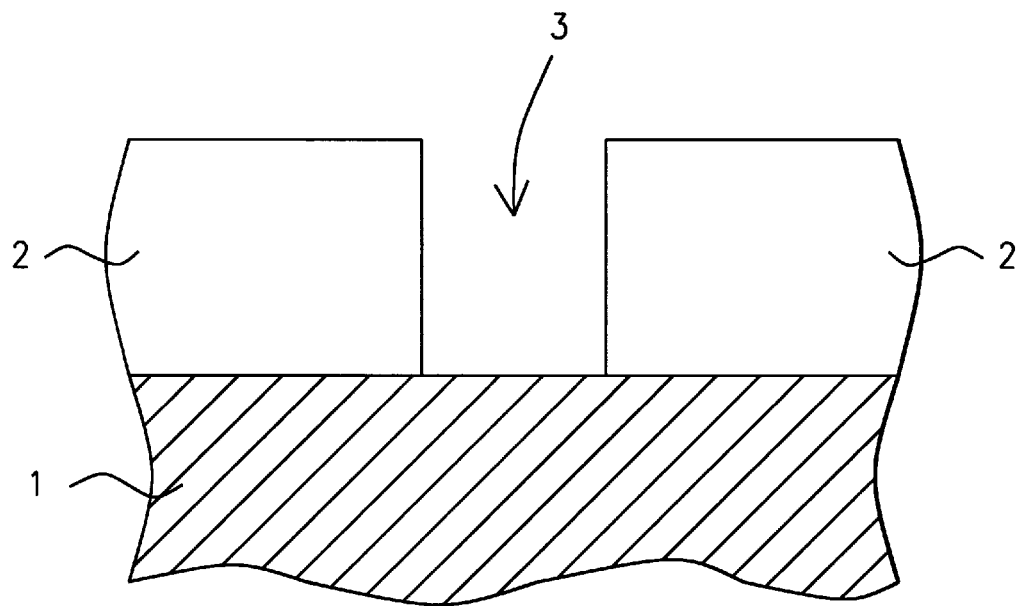
FIGS. 1–3, which schematically, in cross-sectional style, describe key stages of fabrication used to create a tungsten plug, in a deep, narrow diameter opening, encased by a composite adhesive-barrier layer.

The method of forming a tungsten plug, in a deep, narrow diameter opening, featuring a composite adhesive-barrier layer, located on the surfaces of the deep, narrow diameter opening, comprised of an underlying titanium layer, a first titanium nitride layer, obtained via CVD procedures, and an overlying, capping, second titanium nitride layer, obtained via PVD procedures, will now be described in detail. A conductive region 1, comprised of an active device region, such as a source/drain region, in a semiconductor substrate, or a metal interconnect structure, communicating with an underlying semiconductor substrate, is schematically shown in FIG. 1. An insulator layer 2, comprised of either silicon oxide, or borophosphosilicate glass, is formed on underlying conductive region 1, via low pressure chemical vapor deposition, (LPCVD), or via plasma enhanced chemical vapor deposition, (PECVD), procedures, at a thickness between about 3000 to 15000 Angstroms. A photoresist shape, (not shown in the drawings), is used as a mask, to allow an anisotropic reactive ion etching procedure, using $CHF_3$ as an etchant, to create opening 3, in insulator layer 2, exposing a portion of the top surface of conductive region 1. Opening 3, shown schematically in FIG. 1, at a depth between about 3000 to 15000 Angstroms, has a diameter between about 2000 to 5000 Angstroms. The photoresist shape used for definition of opening 3, is removed via plasma oxygen ashing and careful wet cleans.

Figure 2:
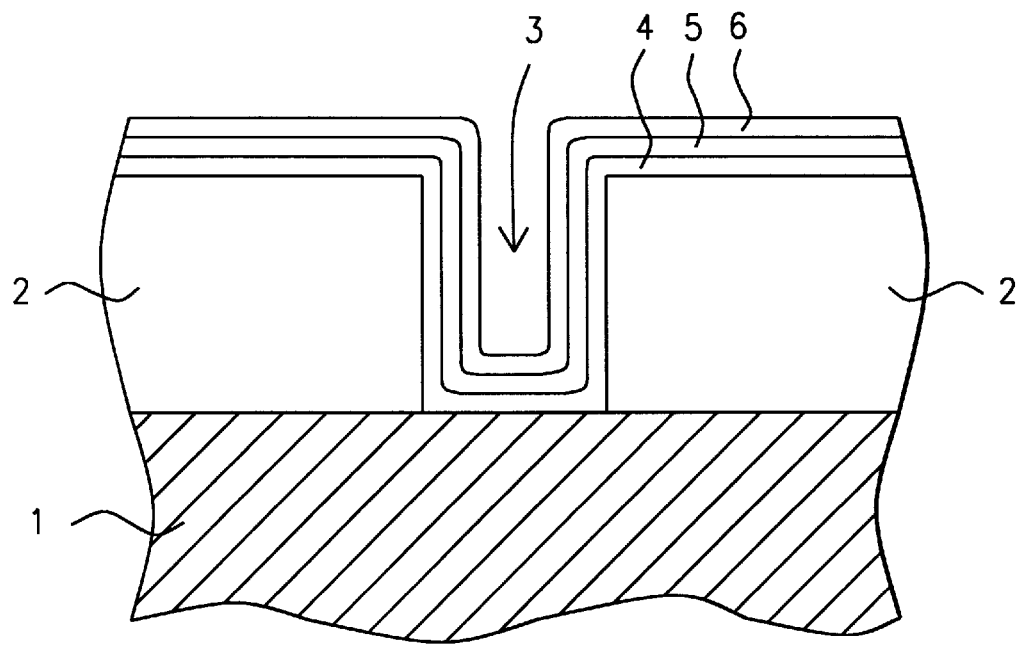

FIG. 2, schematically shows the formation of the composite adhesive-barrier layer, needed to accept a subsequent, overlying tungsten plug. First a titanium layer 4, used to provide adhesion for a subsequent tungsten plug, to the sides of insulator layer 2, exposed in opening 3, is deposited, via a plasma vapor deposition, (PVD), procedure, at a thickness between about 100 to 500 Angstroms. A first titanium nitride barrier layer 5, is next deposited via chemical vapor deposition, (CVD), procedures, to a thickness between about 20 to 200 Angstroms. Titanium nitride is needed to protect underlying regions from exposure to the reaction products generated during a subsequent tungsten deposition. The use of CVD procedures, for titanium nitride layer 5, results in improved conformality, or step coverage, along the sides of the opening 3, when compared to counterpart titanium nitride layers, obtained via PVD procedures. The procedure for attainment of first titanium nitride layer 5, is deposition via a CVD procedure, at a temperature between about 300 to 500° C., using TDMAT, or Ti—$(N(CH_3)_2)_4$, as a precursor, or source, creating a $TiC_xN_y$ layer, followed by a plasma treatment, in a hydrogen-nitrogen ambient, resulting in the desired first titanium nitride layer 5. To insure adequate nucleation of a subsequent tungsten layer, to the underlying barrier layer, an overlying, second titanium nitride layer 6, is deposited, via PVD procedures, at a thickness between about 30 to 300 Angstroms. In addition to PVD titanium nitride layer 6, providing improved nucleation sites for an overlying tungsten layer, compared to the poorer nucleation sites provided by a CVD titanium nitride layer, the PVD titanium nitride layer, will reduce the aging, or resistance increase, occurring with uncapped, CVD titanium nitride layers.

Figure 3:
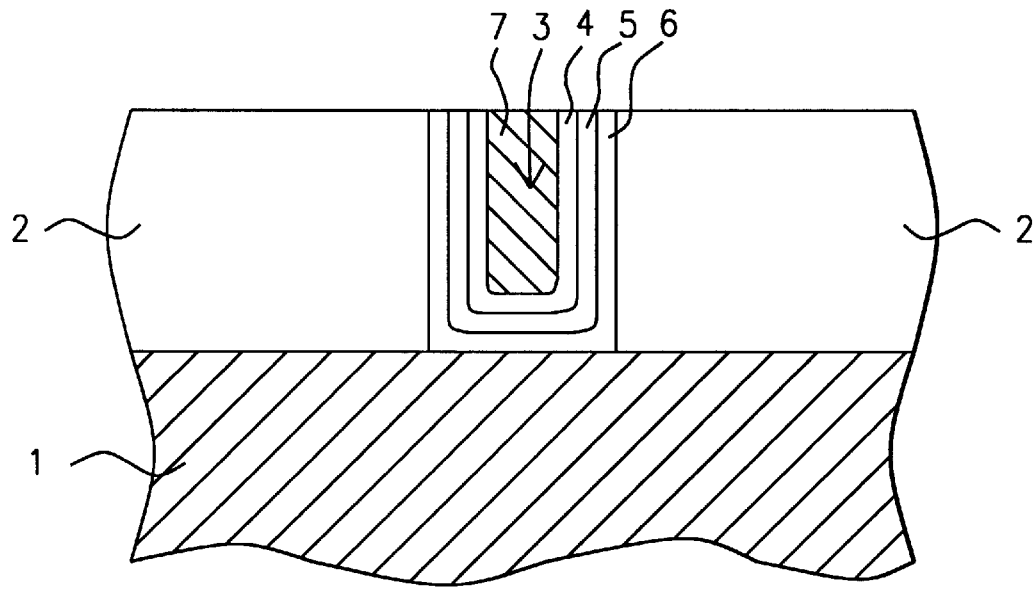

A tungsten layer is next deposited via CVD procedures, at a temperature between about 300 to 500° C., to a thickness between about 2000 to 6000 Angstroms, completely filling opening 3. The reaction products arising from the decomposition of the tungsten hexafluoride source, does not attacked vulnerable regions of the device, as a result of the barrier properties of the titanium nitride layers. Removal of the tungsten layer, as well as the removal of second titanium nitride layer 6, first titanium nitride layer 5, and titanium nitride layer 4, from the top surface of insulator layer 2, is accomplished via a selective, reactive ion etching procedure, using $Cl_2$ or $SF_6$ as an etchant, or via a chemical mechanical polishing procedure, resulting in the creation of tungsten plug 7, in opening 3. This is schematically shown in FIG. 3.

Figure 4:
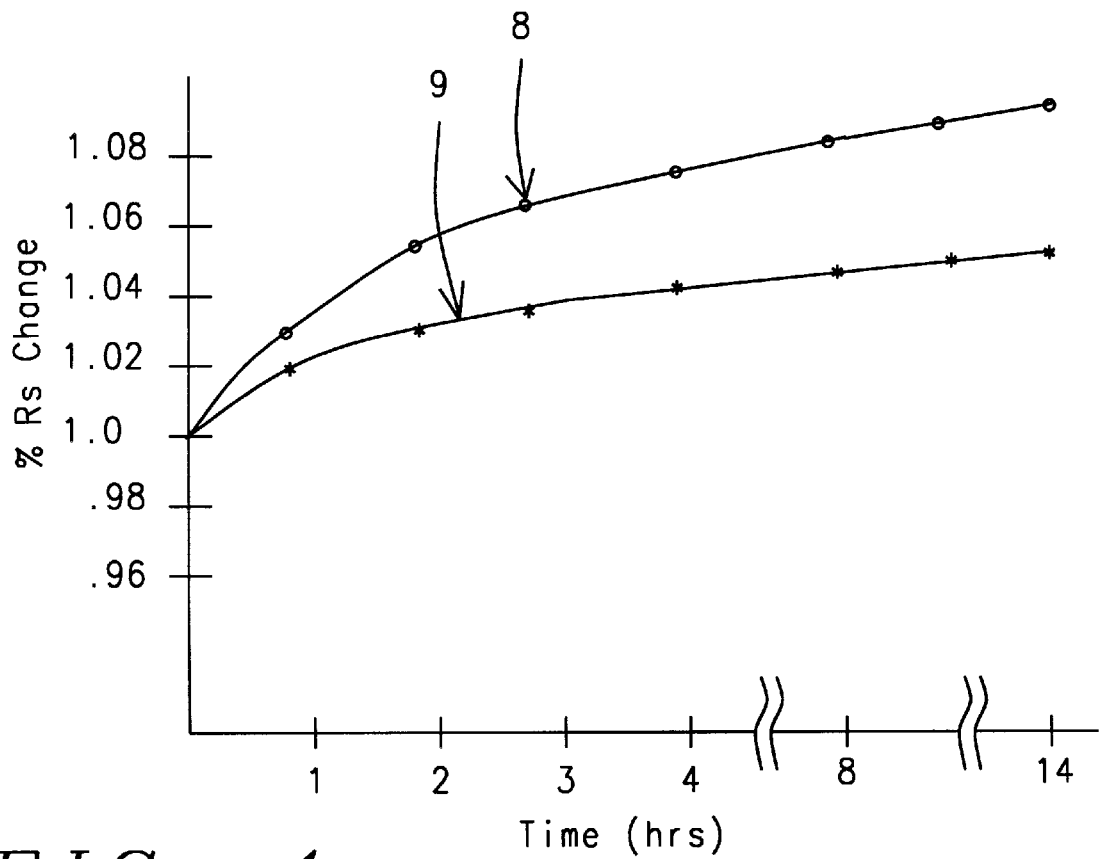
FIG. 4, which shows the relationship of aging, or resistance increase, for a CVD titanium nitride layer, and for a CVD titanium nitride layer, capped with a PVD titanium nitride layer, as a function of time exposed.

The importance of using second titanium nitride layer 6, obtained via PVD procedures, as a cap for underlying, first titanium nitride layer 5, is illustrated in FIG. 4. The relationship of the resistance increase of uncapped, CVD titanium nitride layer 8, and of CVD titanium nitride layer 9, capped with a PVD titanium nitride layer, as a function of time exposed to air, is shown in FIG. 4. The larger increase in resistance for uncapped sample 8, versus capped sample 9, is due to adsorption of moisture, from air, resulting in the aging phenomena. The presence of residue in the CVD titanium nitride layer, resulting from the use of the TDMAT precursor, getters moisture, increasing resistance, while the capping provided by PVD titanium nitride, reduces the gettering phenomena, resulting in stable resistance for the composite layer.

While this invention has been particularly shown and described with reference to the preferred embodiments thereof, it will be understood by those skilled in the art that various changes in form and details may be made without departing from the spirit and scope of his invention.

What is claimed is:

1. A method of forming a metal plug, in an opening in an insulator layer, with a composite adhesive-barrier layer, located between said metal plug, and the surfaces of said opening in said insulator layer, comprising the steps of:

providing a conductive region;

forming an opening in an insulator layer, that overlays said conductive region, with said opening exposing a portion of the top surface of said conductive region;

depositing an adhesive layer on the walls of said opening, in said insulator layer, and on the portion of said conductive region, exposed at the bottom of said opening;

forming a first barrier layer on said adhesive layer;

performing a plasma anneal procedure:

depositing a second barrier layer on plasma annealed, said first barrier layer; and forming said metal plug in said opening, in said insulator layer, with said metal plug overlying, and interfacing, said second barrier layer.

2. The method of claim 1, wherein said conductive region is an active device region in a semiconductor substrate.

3. The method of claim 1, wherein said conductive region is a metal interconnect structure; communicating with a region of the semiconductor substrate.

4. The method of claim 1, wherein said insulator is either a silicon oxide layer, or a borophosphosilicate glass layer, obtained via LPCVD or PECVD procedures, at a thickness between about 3000 to 15000 Angstroms.

5. The method of claim 1, wherein said opening, is formed to a depth in said insulator layer, between about 3000 to 15000 Angstroms, via an anisotropic reactive ion etching procedure, using $CHF_3$ as an etchant.

6. The method of claim 1, wherein the diameter of said opening, in said insulator layer, is between about 2000 to 5000 Angstroms.

7. The method of claim 1, wherein said adhesive layer is a titanium layer, obtained via plasma vapor deposition, (PVD), procedures, at a thickness between about 100 to 500 Angstroms.

8. The method of claim 1, wherein said first barrier layer is a titanium nitride layer, at a thickness between about 20 to 200 Angstroms, obtained via chemical vapor deposition, (CVD), procedures, at a temperature between about 300 to 500° C., using Ti—$(N(CH_3)_2)_4$, or (TDMAT) as a precursor or source, followed by a plasma anneal, in a hydrogen-nitrogen ambient.

9. The method of claim 1, wherein said second barrier layer, is a titanium nitride layer, obtained via PVD procedures, at a thickness between about 30 to 300 Angstroms.

10. The method of claim 1, wherein said metal plug, is a tungsten plug, obtained via deposition of a tungsten layer, via CVD procedures, to a thickness between about 2000 to 6000 Angstroms, and followed by removal of unwanted regions of the tungsten layer, and regions of said second barrier layer, said first barrier layer, and said adhesive layer, via either a selective, reactive ion etching procedure, using $Cl_2$ or $SF_6$ as an etchant, or via a chemical mechanical polishing procedure.

11. A method of forming a tungsten plug, in a deep, narrow diameter opening in an insulator layer, featuring the use of a composite adhesive-barrier layer, located between said tungsten plug, and the surfaces of said opening, and with said composite adhesive-barrier layer comprised of an underlying titanium layer, a first titanium nitride layer, obtained via CVD procedures, and an overlying, second titanium nitride layer, obtained via PVD procedures, comprising the steps of:

providing a conductive region;

depositing an insulator layer;

forming a deep, narrow diameter opening, in said insulator layer, exposing a portion of the top surface of said conductive region;

depositing said titanium layer on the walls of said deep, narrow diameter opening, on the portion of said conductive region, exposed at the bottom of said deep, narrow diameter opening, and on the top surface of said insulator layer;

depositing said first titanium nitride layer, via CVD procedures;

performing a plasma annealing procedure on said first titanium nitride layer;

depositing said second titanium nitride layer, via PVD procedures;

depositing a tungsten layer, completely filling said deep, narrow diameter opening; and removing regions of said tungsten layer, regions of said second titanium nitride layer, regions of said first titanium nitride layer, and regions of said titanium layer, from the top surface of said insulator layer, forming said tungsten plug structure, surrounded by said composite adhesive-barrier layer, in said deep, narrow diameter opening.

12. The method of claim 11, wherein said conductive region is either an active device region, in a semiconductor substrate, or a metal interconnect structure.

13. The method of claim 11, wherein said insulator layer is either a silicon oxide layer, or a borophosphosilicate glass layer, obtained via LPCVD or PECVD procedures, at a thickness between about 3000 to 15000 Angstroms.

14. The method of claim 11, wherein said deep, narrow diameter opening, is formed in said insulator layer, to a depth between about 3000 to 15000 Angstroms, and with a diameter between about 2000 to 5000 Angstroms, via an anisotropic RIE procedure, using $CHF_3$ as an etchant.

15. The method of claim 11, wherein said titanium layer is obtained via PVD procedures, at a thickness between about 100 to 500 Angstroms.

16. The method of claim 11, wherein said first titanium nitride layer is obtained via CVD procedures, at a temperature between about 300 to 500° C., to a thickness between about 20 to 200 Angstroms, using Ti—$(N(CH_3)_2)_4$, (TDMAT), as a source or precursor.

17. The method of claim 11, wherein said plasma-annealing procedure of said first titanium nitride layer, is performed in a hydrogen-nitrogen ambient.

18. The method of claim 11, wherein said second titanium nitride layer is obtained via PVD procedures, at a thickness between about 30 to 300 Angstroms.

19. The method of claim 11, wherein said tungsten layer is obtained via CVD procedures, to a thickness between about 2000 to 6000 Angstroms, at a temperature between about 300 to 500° C., using tungsten hexafluoride as a source.

20. The method of claim 11, wherein said tungsten plug is formed via removal of regions of said tungsten layer, regions of said second titanium nitride layer, regions of said first titanium nitride layer, and regions of said titanium layer, from the top surface of said insulator layer, via a selective, reactive ion etching procedure, using $Cl_2$ or $SF_6$ as an etchant, or via a chemical mechanical polishing procedure.

* * * * *